(12) United States Patent
Chen et al.

(10) Patent No.: US 11,294,274 B2
(45) Date of Patent: *Apr. 5, 2022

(54) PELLICLE ASSEMBLY AND METHOD FOR ADVANCED LITHOGRAPHY

(71) Applicant: Taiwan Semiconductor Manufacturing Company, Ltd., Hsin-Chu (TW)

(72) Inventors: Amo Chen, Hsin-Chu (TW); Yun-Yue Lin, Hsinchu (TW); Ta-Cheng Lien, Hsinchu County (TW); Hsin-Chang Lee, Hsinchu County (TW); Chih-Cheng Lin, Kaohsiung (TW); Jeng-Horng Chen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 16/741,342

(22) Filed: Jan. 13, 2020

(65) Prior Publication Data

US 2020/0150527 A1  May 14, 2020

Related U.S. Application Data

(63) Continuation of application No. 15/685,806, filed on Aug. 24, 2017, which is a continuation of application
(Continued)

(51) Int. Cl.
*G03F 1/64* (2012.01)
*G03F 1/62* (2012.01)
(Continued)

(52) U.S. Cl.
CPC ............ *G03F 1/64* (2013.01); *G03F 1/22* (2013.01); *G03F 1/62* (2013.01); *G03F 7/20* (2013.01); *H01L 21/0274* (2013.01)

(58) Field of Classification Search
CPC ..... G03F 1/64; G03F 1/22; G03F 1/62; G03F 7/20
See application file for complete search history.

(56) References Cited

U.S. PATENT DOCUMENTS 4,939,070 A * 7/1990 Brunsvold ............. G03F 7/039
430/296
5,300,348 A   4/1994 Kubota et al.
(Continued)

FOREIGN PATENT DOCUMENTS

JP     63262651     10/1988
JP     200316545     7/1991
(Continued)

OTHER PUBLICATIONS

Machine translation of jp 04-190355 (1992).*
Machine translation of JP 04-196117 (1992).*
Machine translation fo JP 2006-184817 (2006).*

*Primary Examiner* — Martin J Angebranndt
(74) *Attorney, Agent, or Firm* — Haynes and Boone, LLP

(57) ABSTRACT

The present disclosure provides an apparatus for a semiconductor lithography process in accordance with some embodiments. The apparatus includes a pellicle membrane, a porous pellicle frame, a mask with a patterned surface, a first thermal conductive adhesive layer that secures the pellicle membrane to the porous pellicle frame, and a second thermal conductive adhesive layer that secures the porous pellicle frame to the mask.

19 Claims, 13 Drawing Sheets

Related U.S. Application Data

No. 14/973,562, filed on Dec. 17, 2015, now Pat. No. 9,759,997.

(51) Int. Cl.
  *G03F 1/22* (2012.01)
  *G03F 7/20* (2006.01)
  *H01L 21/027* (2006.01)

(56) References Cited

U.S. PATENT DOCUMENTS

| | | | |
|---|---|---|---|
| 6,368,683 | B1 | 4/2002 | Shirasaki |
| 6,822,731 | B1 | 11/2004 | Laganza et al. |
| 7,531,275 | B2 | 5/2009 | Zhang et al. |
| 8,628,897 | B1 | 1/2014 | Lu et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,759,997 | B2 | 9/2017 | Chen et al. |
| 10,036,951 | B2 | 7/2018 | Hsu et al. |
| 10,534,256 | B2* | 1/2020 | Chen .................. G03F 1/64 |
| 2004/0135987 | A1* | 7/2004 | Galburt ............ G03F 7/70983 355/75 |
| 2004/0151990 | A1* | 8/2004 | Ganguli .................. G03F 1/64 430/5 |
| 2005/0042524 | A1* | 2/2005 | Bellman .................. G03F 1/62 430/5 |
| 2005/0088637 | A1* | 4/2005 | Laganza ............ G03F 7/70983 355/53 |
| 2007/0287074 | A1 | 12/2007 | Pas |
| 2008/0152873 | A1* | 6/2008 | Okoroanyanwu ..... B82Y 10/00 428/195.1 |
| 2009/0274962 | A1 | 11/2009 | Kubota et al. |
| 2011/0132258 | A1* | 6/2011 | Nagata ..................... G03F 1/64 118/504 |
| 2011/0275012 | A1 | 11/2011 | Horikoshi |
| 2013/0088669 | A1* | 4/2013 | Lee ....................... G02F 1/1347 349/96 |
| 2013/0101927 | A1 | 4/2013 | Taneichi et al. |
| 2015/0205193 | A1 | 7/2015 | Yamada et al. |
| 2015/0286133 | A1 | 10/2015 | Horikoshi |
| 2015/0293460 | A1 | 10/2015 | Takehisa et al. |
| 2016/0059535 | A1 | 3/2016 | Koba |
| 2016/0147141 | A1 | 5/2016 | Ono et al. |
| 2016/0349610 | A1* | 12/2016 | Hsu ......................... G03F 1/64 |
| 2017/0108771 | A1 | 4/2017 | Horikoshi |

FOREIGN PATENT DOCUMENTS

| | | | |
|---|---|---|---|
| JP | 04-190355 | * | 7/1992 |
| JP | 04-196117 | * | 7/1992 |
| JP | 2000292909 | | 10/2000 |
| JP | 04237056 | | 8/2004 |
| JP | 2006-184817 | * | 7/2006 |
| JP | 2009003111 | | 1/2009 |
| JP | 2011053603 | | 3/2011 |
| JP | JP-2017078728 | | 4/2017 |
| KR | 20080099920 | | 11/2008 |
| WO | WO-2006113859 | | 10/2006 |
| WO | WO-2014188710 | | 11/2014 |
| WO | WO-2016001351 | | 1/2016 |

* cited by examiner

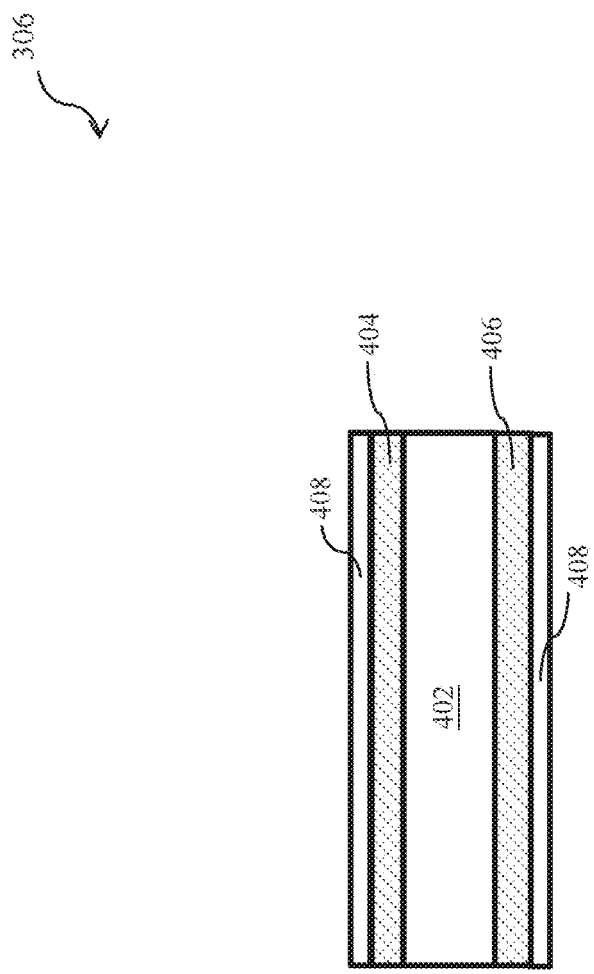

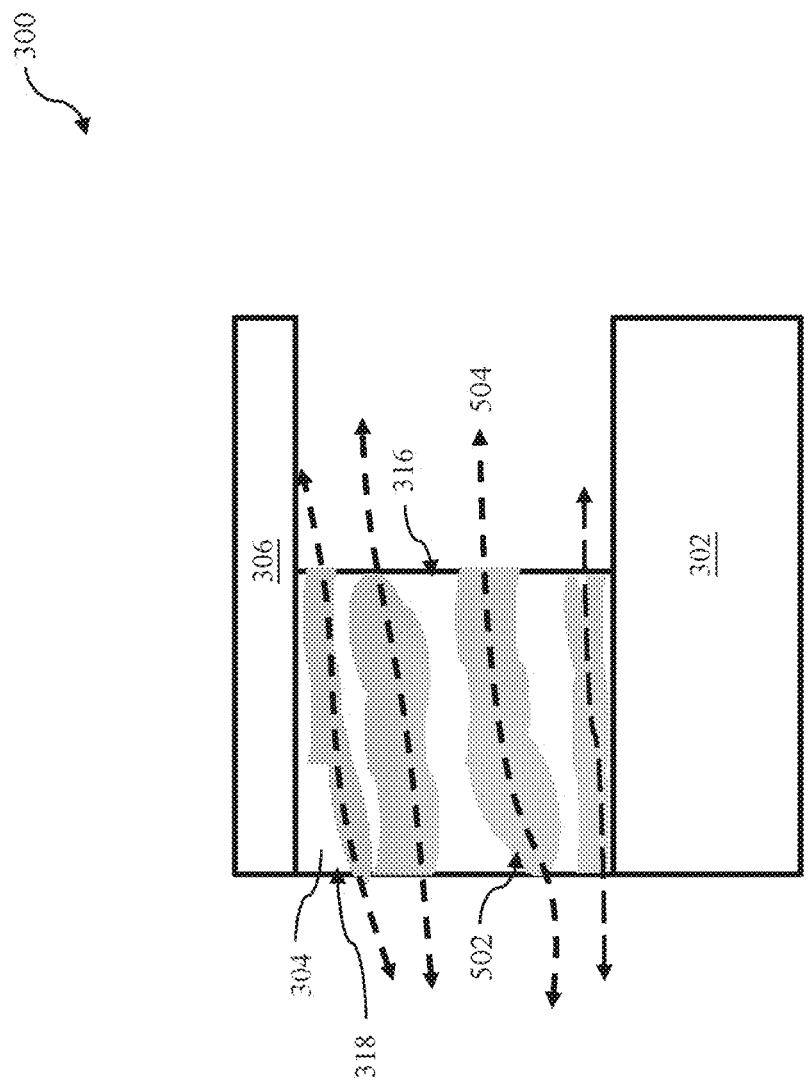

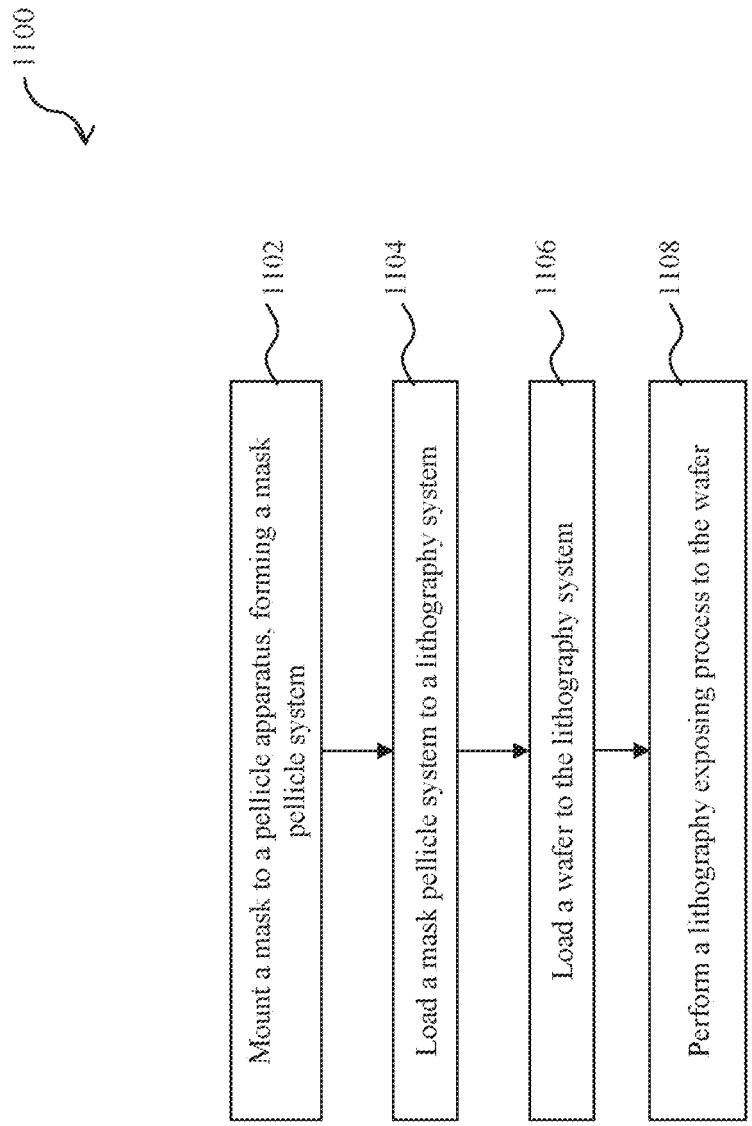

PELLICLE ASSEMBLY AND METHOD FOR ADVANCED LITHOGRAPHY

PRIORITY

This is a continuation of U.S. patent application Ser. No. 15/685,806, filed Aug. 24, 2017, issued at U.S. patent Ser. No. 10/534,256, which is a continuation of U.S. patent application Ser. No. 14/973,562, filed Dec. 17, 2015, issued U.S. Pat. No. 9,759,997, herein incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle assembly, collectively referred to as a mask system. The pellicle assembly includes a transparent thin membrane and a pellicle frame, where the membrane is mounted over a pellicle frame. The pellicle protects the mask from fallen particles and keeps the particles out of focus so that they do not produce a patterned image, which may cause defects when the mask is being used. The membrane is typically stretched and mounted over the pellicle frame, and is attached to the pellicle frame by glue or other adhesives. An internal space may be formed by the mask, the membrane, and the pellicle frame. Deficiencies in balancing the pressure difference between the internal and external pressure may cause the membrane to become distorted, wrinkled, broken, or otherwise damaged, thereby rendering the mask pellicle system unusable. Thus, existing techniques for fabricating mask pellicle systems have not proved entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a sectional view of a pellicle membrane, in accordance with some embodiments.

FIG. 5 is a partial sectional view of a pellicle frame, in accordance with some embodiments.

FIG. 11 is a flowchart of a method constructed in accordance with some other embodiments.

DETAILED DESCRIPTION

Figure 1:
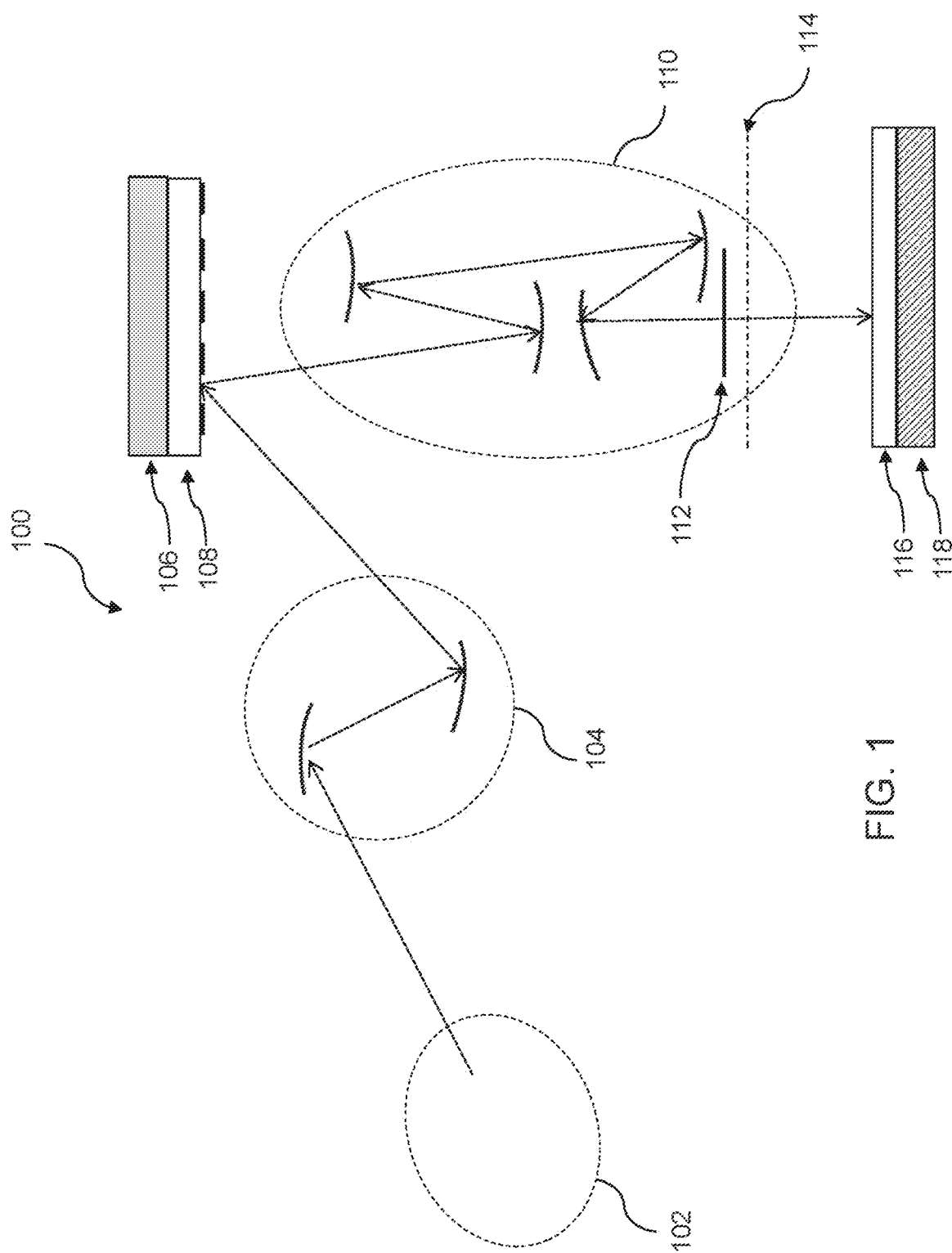
FIG. 1 is a schematic view of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm$^2$. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

The lithography system may include other components and may have other alternatives. In some embodiments, the lithography system 100 may include a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

Figure 2:
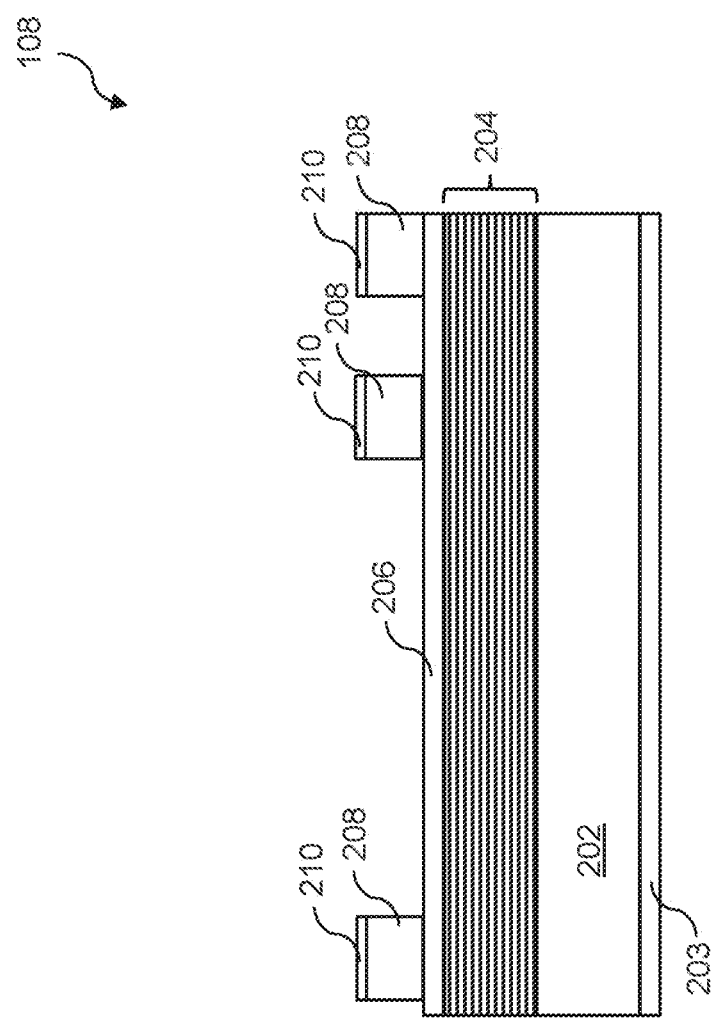
FIG. 2 is a cross-section of a mask, in accordance with some embodiments.

Returning to the mask 108, and with reference to the example of FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_zN_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may be a PSM which utilizes interference produced by phase differences of light reflected therefrom. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask. In some illustrative embodiments of a PSM, the patterned layer 208 is reflective layer with a material stack similar to that of the multi-layer structure 204.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. As shown in FIG. 2, particles may be unintentionally deposited on the surface of the capping layer 206 and can result in degradation of lithographically transferred patterns if not removed. Particles may be introduced by any of a variety of methods such as during an etching process, a cleaning process, and/or during handling of the EUV mask 108. Accordingly, the mask 108 is integrated in a pellicle assembly and is protected by the pellicle assembly. The mask and the pellicle assembly are collectively referred to as a mask-pellicle system. For example, during the lithography patterning process by the lithography system 100, the mask-pellicle system is secured to the mask stage 106.

Figure 3A:
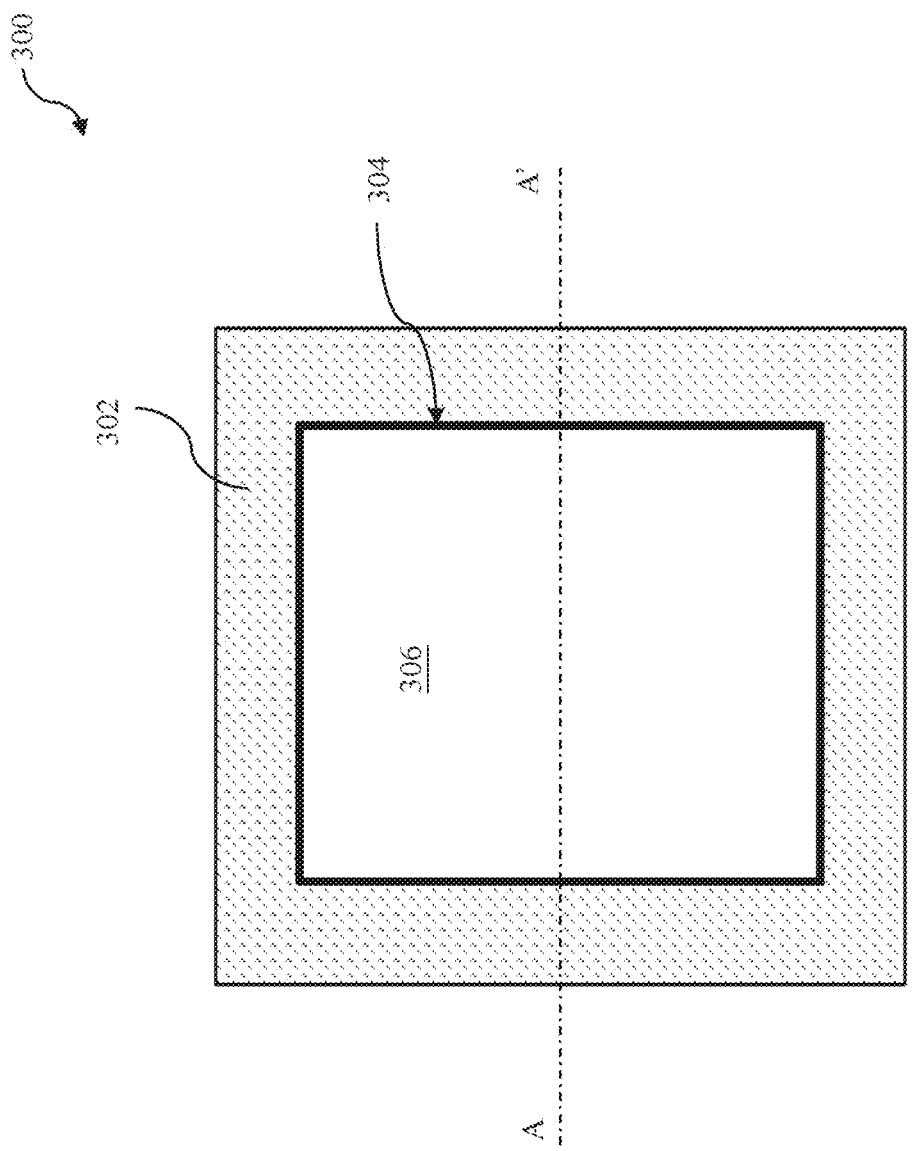
FIGS. 3A, 3B, and 3C are a top-view, a perspective view, and a cross-sectional view along line A-A', respectively, of a mask pellicle system, in accordance with some embodiments.
Figure 3B:
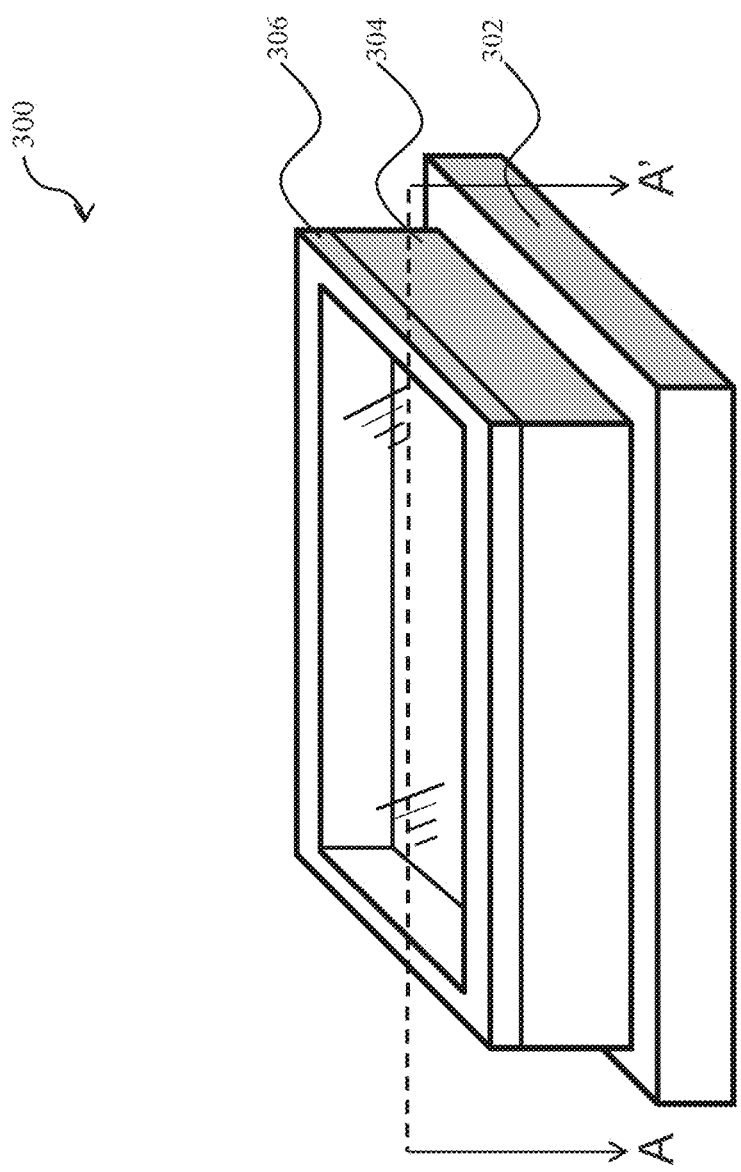
Figure 3C:
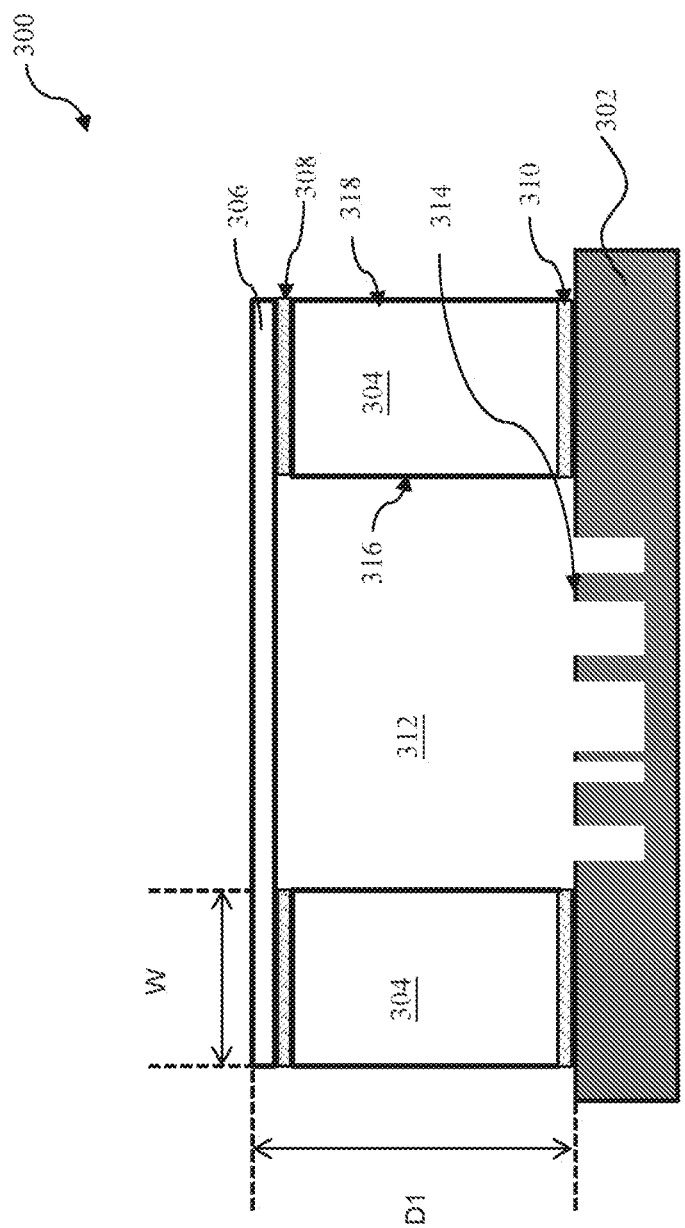

With reference to FIGS. 3A, 3B, and 3C, illustrated therein is a top-view, a perspective view, and a cross-sectional view along line A-A', respectively, of a mask pellicle system 300. Referring to FIGS. 3A, 3B, and 3C, the mask pellicle system 300 and a method of using the same are described.

The mask pellicle system 300 includes a mask 302, a pellicle frame 304 and a membrane (or pellicle membrane) integrated together through adhesive material layers 308 and 310. As discussed above, the mask 302 also includes a patterned surface 312 used to pattern a semiconductor substrate by a lithographic process. In some embodiments, the mask 302 may be substantially the same as the mask 108, discussed above. In the present embodiment, the mask 302 is integrated in the mask pellicle system 300 and is secured on the mask stage 106 collectively with the membrane 306 and the pellicle frame 304 during a lithography patterning process.

The membrane 306 is configured proximate to the mask 302 and is attached to the pellicle frame 304 through the adhesive layer 308. Particularly, the membrane 306 is attached to the pellicle frame 304 through the adhesive material layer 308. The mask 302 is further attached to the pellicle frame 304 through the adhesive material layer 310. Thus, the mask 302, the pellicle frame 304 and the membrane 306 are thus configured and integrated to enclose an internal space 312. The patterned surface 314 of the mask 302 is enclosed in the internal space 312 and is therefore protected from contamination during a lithography patterning process, mask shipping, and mask handling.

The membrane 306 is made of a thin film transparent to the radiation beam used in a lithography patterning process, and furthermore has a thermal conductive surface. The membrane 306 is also configured proximate to the patterned surface 314 on the mask 302 as illustrated in FIG. 3C. In various embodiments, the membrane 306 includes a transparent material layer with a thermal conductive film on one surface (or both surfaces).

FIG. 4 is a cross-sectional view of the membrane 306, constructed in accordance with some embodiments. The membrane 306 includes a transparent layer 402 of one or more materials including silicon, such as polycrystalline silicon (poly-Si), amorphous silicon a-Si), doped silicon (such as phosphorous doped silicon-SiP) or a silicon-based compound. Alternatively, the transparent layer 402 includes polymer, graphene, or other suitable material. The transparent layer 402 has a thickness with enough mechanical strength but not degrading the transparency of the membrane. In some examples, the transparent layer 402 has a thickness ranging between 30 nm and 50 nm.

In some embodiments, the membrane 306 may further include a first capping layer 404 formed on the external surface of the transparent layer 402 or additionally a second capping layer 406 formed on the internal surface of the transparent layer 402. The capping layer (404 or 406) is designed to protect the transparent layer 402 from attacking, such as by chemicals and/or particles. For example, when the transparent layer 402 is a silicon layer, it is susceptible to environmental chemicals or particles. In some embodiments, the capping layer includes silicon oxide (SiO), silicon nitride (SiN), silicon carbide (SiC), or a mixture thereof, such as silicon carbon nitride (SiCN), silicon oxynitride (SiON). In some embodiments, the capping layer includes boron nitride (BN) or boron carbide (BC). The capping layer is thin without degrading the transparency of the membrane 306. In some example, the thickness of the capping layer (404 and 406 as well if it is present) ranges between 3 nm and 10 nm, and is preferred to be 5 nm with a variation of 10% or less. The capping layer may be formed by a suitable deposition technique, such as chemical vapor deposition (CVD), atomic layer deposition (ALD) or other suitable technique.

The membrane 306 has a thermal conductive surface, such as a thermal conductive film 408 formed on either one or both surfaces of the membrane 306 to dissipate the heat, such as the heat generated during the lithography patterning process, thereby eliminate or reduce the warpage, other deformation or other heat-related degradation. In some embodiments, the thermal conductive film 408 includes ruthenium (Ru), or carbon-based material, such as graphite, graphene, diamond, or carbon nanotube. The thermal conductive film has a thickness ranging between 3 nm and 10 nm, and is preferred to be 5 nm with a variation of 10% or less. The thermal conductive layer may be formed by a suitable deposition technique, such as physical vapor deposition (PVD), CVD, ALD or other suitable technique.

Alternatively, the capping layer and the thermal conductive film may be combined into one material thermal conductive capping layer to collectively serve both functions—thermal conduction and protection. In some embodiments, the thermal conductive capping layer includes copper, nickel, iron, alloy of a combination thereof, or other suitable metal or metal alloy. Such thermal conductive capping layer may be formed by PVD, ALD, plating, or a combination thereof.

The mask pellicle system 300 also includes a pellicle frame 304 configured such that the membrane 306 can be attached and secured to the pellicle frame 304. The pellicle frame 304 may be designed in various dimensions, shapes, and configurations. Among those and other alternatives, the pellicle frame 304 may have one single component or multiple components. The pellicle frame 304 includes a material with mechanical strength, and designed in a shape, dimensions, and a configuration so as to secure the membrane 306 properly across the pellicle frame 304. In some embodiments, the pellicle frame 304 may be entirely formed by a porous material.

The pellicle frame 304 includes a porous material designed for ventilation and pressure balance since the pellicle-mask system 300 is in a vacuum environment when secured on the mask stage 106 during the lithography patterning process. As illustrated in FIG. 3C, the porous material of the pellicle frame 304 has connected-pore channels extended from an internal surface 316 to an external surface 318 of the pellicle frame 304 for ventilation. Especially, the pellicle frame 304 is formed by a pellicle-frame-forming process with a mechanism rendering the pore sizes of the porous material tunable during the pellicle-frame-forming process.

FIG. 5 is a cross-sectional view of the mask pellicle system 300, in portion, constructed in accordance with some embodiments. In the pellicle frame 304, connected-pore channels 502 are randomly configured with paths 504 extended from the internal surface 316 to the external surface 318. In various examples, the random configuration means one or any combination of the following: the pore size of a connected-pore channel varies randomly from the internal surface 316 to the external surface 318; a connected-pore channel routes randomly; and the connected-pore channels are randomly arranged.

In addition to a porous structure, the porous material is chosen to have other characteristic, such as thermal conductive, high mechanical strength, and/or light weight. The porous material of the pellicle frame 304 may include metal, alloy or ceramic material. In some embodiments, the porous material of the pellicle frame 304 includes Al, $SiO_2$, Al—Mg, Al—Ti, Al—Ni, Al—Fe, AlN, $Al_2O_3$, $ZrO_2$, BN, BC, or a combination thereof.

The pellicle-frame-forming process includes forming a porous material and shaping the porous material to form the pellicle frame 304. In some embodiments, the shaping of the porous material includes injection molding, compress molding, lathe, milling machine, laser dicing or a combination thereof. In some embodiments, the shaping of the porous material and the forming of the porous material to form the pellicle frame may be combined to be implemented simultaneously or overlapped instead of sequentially. For example, in the compress molding method, sintering to form the porous material and molding may be implemented simultaneously. The forming of the porous material may be achieved by one or more suitable mechanisms and is further described below in accordance with some embodiments.

In some embodiments, the porous material of the pellicle frame 304 is formed by solid sintering. The forming process includes mixing solid powder (solid particles); and sintering the solid powder at an elevated temperature to form the porous material. The solid particles are made of a metal, an alloy, or a mixture of different materials, such as those listed above. For example, the solid particles include Al, $SiO_2$, AlN, $Al_2O_3$, $ZrO_2$, BN or BC. The solid particles may include a first subset of a first material and a second subset of a second material different from the first material. For example, the solid particles include two types of materials, such as Al—Mg, Al—Ti, Al—Ni or Al—Fe. The sintering temperature ranges from 500° C. to 1000° C., depending on the metal or alloy of the solid particles. The sintering duration may range between a few seconds and a few hours. The forming process may further include preparing the solid powder. In various examples, the solid particles may have spherical shape, cubic shape or irregular shape, such as olive shape, ellipse shape, egg shape or cylinder. The size of the solid particles ranges between 50 nm and 100 nm in some embodiments. The solid particles may have a substantial uniform size or alternatively have sizes distributed in a broad range. The porosity ranges from 10% to 40%, depending on various factors, such as the size distribution, particle shape and orientation. The porosity is defined as the porous volume over the total volume of the porous material. In one example, the solid particles include particles two sizes mixed together (bimodal mixing). In another example, the solid particles having spherical shape and substantial same size, the porosity may range from 20% to 40% to form through channels extended from the internal surface 316 to the external surface 318 of the pellicle frame 304.

Figure 6C:
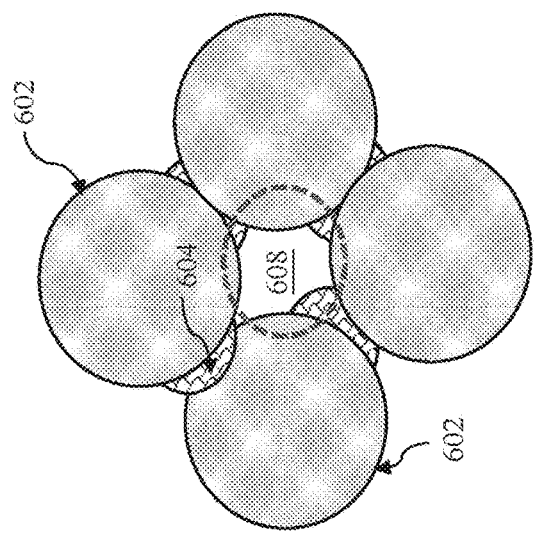
FIGS. 6A, 6B and 6C are schematic views of a porous material of the pellicle frame at various fabrication stages, in accordance with some embodiments.
Figure 6B:
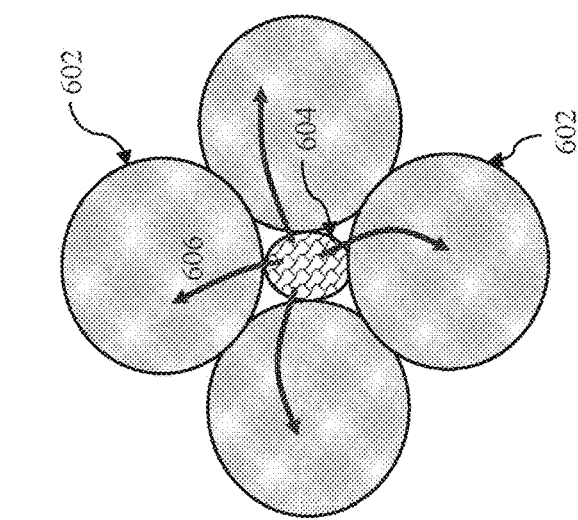
Figure 6A:
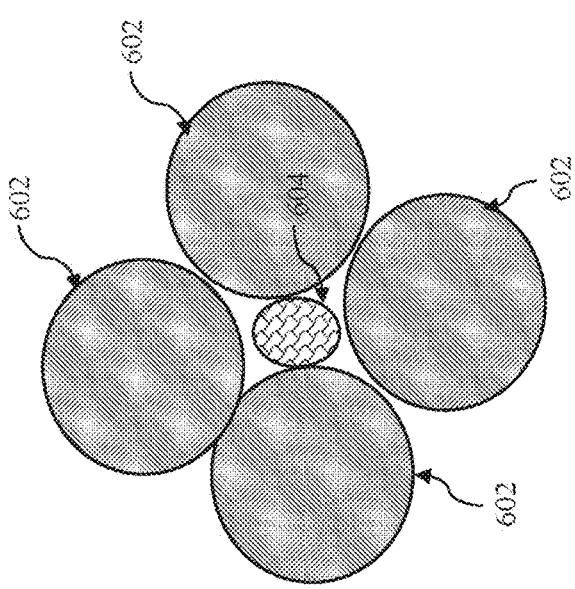

In some embodiments, the pellicle frame 304 is formed by liquid sintering, as illustrated in FIG. 6A, FIG. 6B and FIG. 6C in schematic views at various stages. In the liquid sintering, two types of solid particles (powders) 602 and 604 are mixed together as illustrated in FIG. 6A. The two types of powders are usually two types of metals or metal alloys. The two types of powders may include the materials listed above in in proper pair or other suitable materials. In some embodiments, the two types of powders include Al—Mg, Al—Ti, Al—Ni, Al—Fe, or Al—Si. In the mixed powder, the two types of particles are contacted with each other and atomic diffusion 606 occurs, as illustrated in FIG. 6B. By atomic diffusion, eutectic composition is formed at the interfaces between the two types of particles. Then, an annealing process (sintering) is applied to the mixed powder such that the eutectic composition is melted, thereby forming a porous material, as illustrated in FIG. 6C. The sintering temperature is equal to or higher than the eutectic temperature that is the melting point of the eutectic composition. The eutectic temperature is usually lower than the melting point of each type of particles (602 or 604). In some embodiments, the sintering temperature is equal to or higher than the eutectic temperature but is lower than both melting point (of the first particles 602 and the second particles 604). In some embodiments, the sintering temperature ranges from 200° C. to 1000° C., depending on the metal or alloy of the solid particles. The sintering duration may range between a few seconds and a few hours. The forming process may further include preparing the solid powder. In various examples, the solid particles may have spherical shape, cubic shape or irregular shape, such as olive shape, ellipse shape, egg shape or cylinder. The size of the solid particles ranges between 50 nm and 100 nm in some embodiments. The solid particles may have a substantial uniform size or alternatively have sizes distributed in a broad range. The filler ratio of the first particles 602 ranges from 40% to 80%, depending on various factors, such as the size distribution, particle shape and orientation. Here, the filler ratio is defined as the volume of the first particles 602 over the total volume of the porous material.

In some embodiments, the pellicle frame 304 is formed by evaporation sintering. In this method, a powder (solid particles, such as metal, metal alloy or ceramic material as listed above) is mixed with a volatile material (such as wax) together. Then, an annealing (sintering) process is applied to the mixture with an elevated temperature such as solid particles are bonded together and the volatile material is evaporated, resulting in pores formed in the sintered material. The filler ratio ranges from 0.1% to 74%, depending on various factors, such as the size distribution, particle shape and orientation. In the present case, the filler ratio is defined as relative volume of the volatile material over the total volume of the mixture. In order to form the porous material with connected-pore channels, the filler ratio is tuned to a proper range, depending on the shapes and the size distribution of the solid particles. In another example, the solid particles having spherical shape and substantial same size, the filler ratio may range from 20% to 30%.

In various embodiments, the pore channels 502 are configured to equalize pressures between the internal space 312 and the space surrounding the mask pellicle system 300. Additionally, the pore channels 502 are configured to prevent particles from entering the internal space 312. Therefore, properties of the pore channels 502, including sizes and shapes of the pores, structures, density, inter-pore distances, orientation, and/or uniformity of the pore channels, may be configured in accordance with application requirements. The method to form the porous pellicle frame 304 provides a mechanism of tuning the pore size, such as by tuning one or more the following parameters: the shape, size and size distribution of the solid particles, filler ratio or porosity, alignment or orientation. The tunable mechanism of the pore channels enable the fabrication of the pellicle frame with more freedom for better design in terms of the ventilation and particle prevention.

Referring back to FIG. 3C, the membrane 306 and the mask 302 are integrated with the pellicle frame 304 through the adhesive layers 308 and 310. The adhesive layers include thermal conductive adhesive material to function as an adhesive interface and further to provide thermal conduction such that the heat generated during the lithography patterning can be properly dissipate and heat-related stress and warpage are eliminated or reduced. Particularly, the thermal conduction from the membrane 306, pellicle frame 304 and the adhesive layers renders the mask pellicle system 300 have continuous thermal conduction so that the heat can be properly conduced to the environment. In some embodiments, the thermal conductive adhesive material is further designed to have other characteristics, such as mechanical strength, no defect and outgassing, EUV compatible (no significant degradation upon EUV radiation), sustainability to high service temperature, water soluble for easy demounting process (the mask can be easily detached from the pellicle frame for cleaning).

Figure 7:
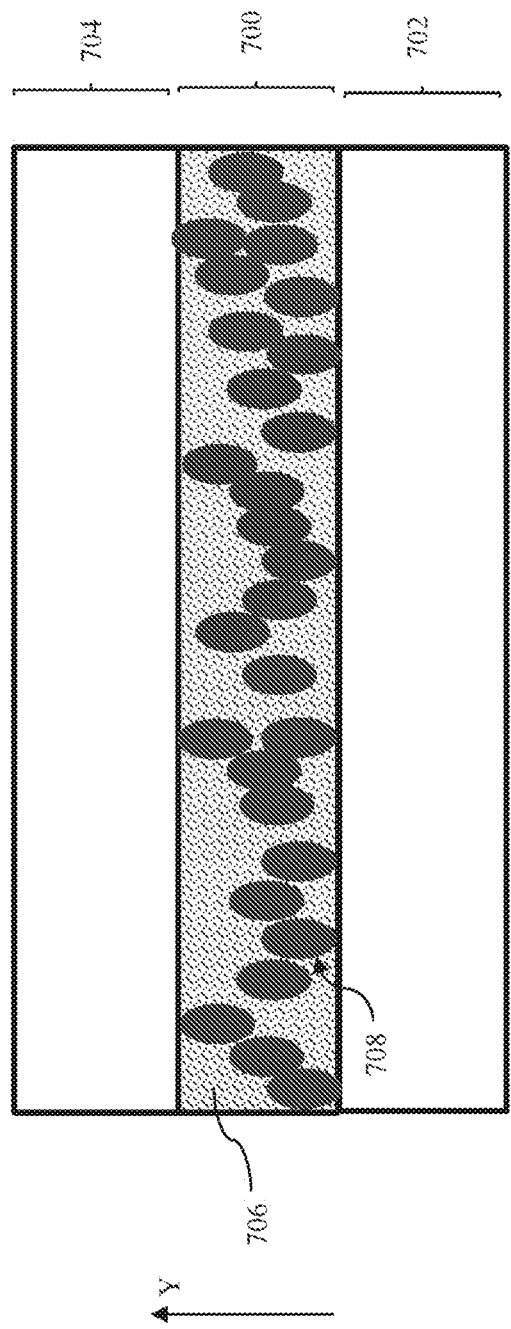
FIG. 7 is a sectional view of a thermal conductive adhesive layer with two features bonded together thereby, in accordance with some embodiments.

FIG. 7 is a schematic view of the thermal conductive adhesive layer 700, constructed according to some embodiments. The thermal conductive adhesive layer 700 bond a first feature 702 and a second feature 704 together; and further provide thermal conduction from the first feature 702 to the second feature 704. In some embodiments, the thermal conductive adhesive layer 700 may be substantially the same as the thermal conductive adhesive layer 308 or 310, discussed above. In furtherance of the embodiments, the first feature 702 and the second feature 704 are the pellicle frame 304 and the membrane 306, respectively, or the mask 302 and the pellicle frame 304, respectively, as illustrated in FIG. 3C. The thermal conductive adhesive layer 700 includes an adhesive component 706 and a thermal conductive component 708 dispersed in the adhesive component. In some embodiments, the thermal conductive component 708 is mixed in or chemically bonded with the adhesive component 706.

In some embodiments, the adhesive component 706 is a proper adhesive material, such as thermal plastic elastomer or other macromolecular adhesive material cured by heat or drying. In various examples, the adhesive component includes Styrene Ethylene/Butylene Styrene rubber (SEBS), Thermoplastic Polyester Elastomer (TPE), polyether urethane (TPU), Thermoplastic Olefinic elastomer (TPO), or Thermoplastic Vulcanisate (TPV).

The thermal conductive component 708 includes metal, ceramic, alloy, compound of metal and ceramic, or polymer in various embodiments. For examples, the thermal conductive component includes Al, Ag, AlO, AlN, BN, carbon (graphene, nanotube or graphite sheet)) Be, $B_4C$, SiC, or a mixture thereof. aluminum, copper, thermal conductive polymer or a combination thereof. The thermal conductive component may include a plurality of particles dispersed in the adhesive component. The thermal conductive particles may have regular shape or irregular shape, such as spherical shape or cubic shape, olive shape, ellipse shape, egg shape, cylinder, or a combination thereof. The size of the thermal conductive particles ranges between 50 nm and 100 nm in some embodiments. The thermal conductive particles may have a substantial uniform size or alternatively have sizes distributed in a broad range. In the mixture of the adhesive component 706 and the thermal conductive component 708, the filler ratio is in a proper range such that the thermal conductive particles are connected to form thermal conductive path from the first feature 702 to the second feature 704. In this case, the filler ratio is defined as the relative volume of the thermal conductive component over the total volume of the mixture. In some embodiments, the filler ratio ranges from 0.1% to 74%, depending on various factors, such as the size distribution, particle shape and orientation. For example, the thermal conductive particles have elongated shape and are substantially aligned along the direction Y, it still able to form the thermal conductive path when the filler ratio is much less than 74%. This is further explained below.

Figure 8:
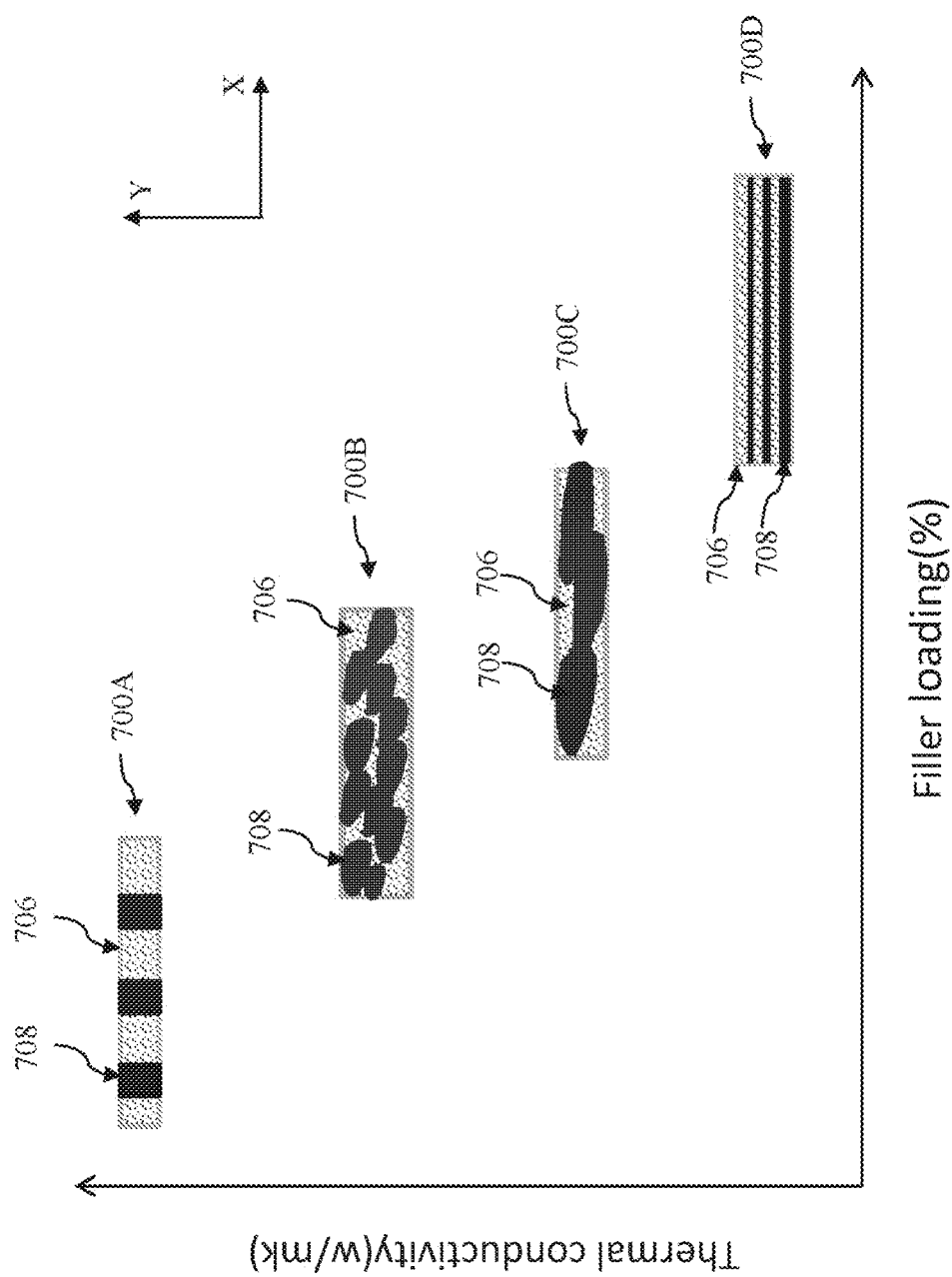
FIG. 8 is a schematic diagram of a thermal conductive adhesive layer and a relationship between the thermal conductivity and the filler loading, constructed in accordance with some embodiments.

In FIG. 8, various configurations (shape, size, orientation and arrangement) are schematically illustrated for relationship between the configuration and the thermal conductivity. The horizontal axis represents the filler ratio (filler loading) in % and the vertical axis represents thermal conductivity in w/mk. In the thermal conductive adhesive layer 700A, the thermal conductive particles are cylinders and are oriented along the direction Y. The thermal conductivity is very high even the filler ratio is much less. In the thermal conductive adhesive layer 700B, the thermal conductive particles have elongated shape and smaller size. The thermal conductivity is relatively high when the filler ratio is relatively less. In the thermal conductive adhesive layer 700C, the thermal conductive particles have elongated shape and greater size. The thermal conductivity is relatively less even the filler ratio is relatively higher but still less than 74%. In the thermal conductive adhesive layer 700D, the thermal conductive particles are cylinders and are oriented along X. The thermal conductivity is substantially low (zero or close to zero) even when the filler ratio is very higher (74% or more). Above examples are illustrated for understanding the relevant parameters to impact the thermal conductivity for better designing the thermal conductive adhesive layer. Those parameters include shape, size, size distribution, arrangement (such as randomly arranged or aligned), and the filler ratio. Therefore, the thermal conductive particles are properly considered in designing the thermal conductive adhesive layer for enough thermal conduction and mechanical strength while maintaining the adhesion effectiveness. For example, the thermal conductive adhesive layer 700A is better than the thermal conductive adhesive layer 700D in terms of thermal conductivity and adhesion effect.

In one example, the solid particles include particles two sizes mixed together (bimodal mixing). In another example, the solid particles having spherical shape and substantial same size, the filler ratio can be as high as 74% to form through channels extended from the internal surface 316 to the external surface 318 of the pellicle frame 304.

In another example, the thermal conductive particles have elongated shape and are oriented by a force, such as external field (electric field or magnetic field, for examples) to the Y direction during the corresponding bonding process. Thus formed adhesive layer, similar to that illustrated in FIG. 7, has a structure similar to the thermal conductive adhesive layer 700A and provides higher thermal conductivity.

Figure 9:
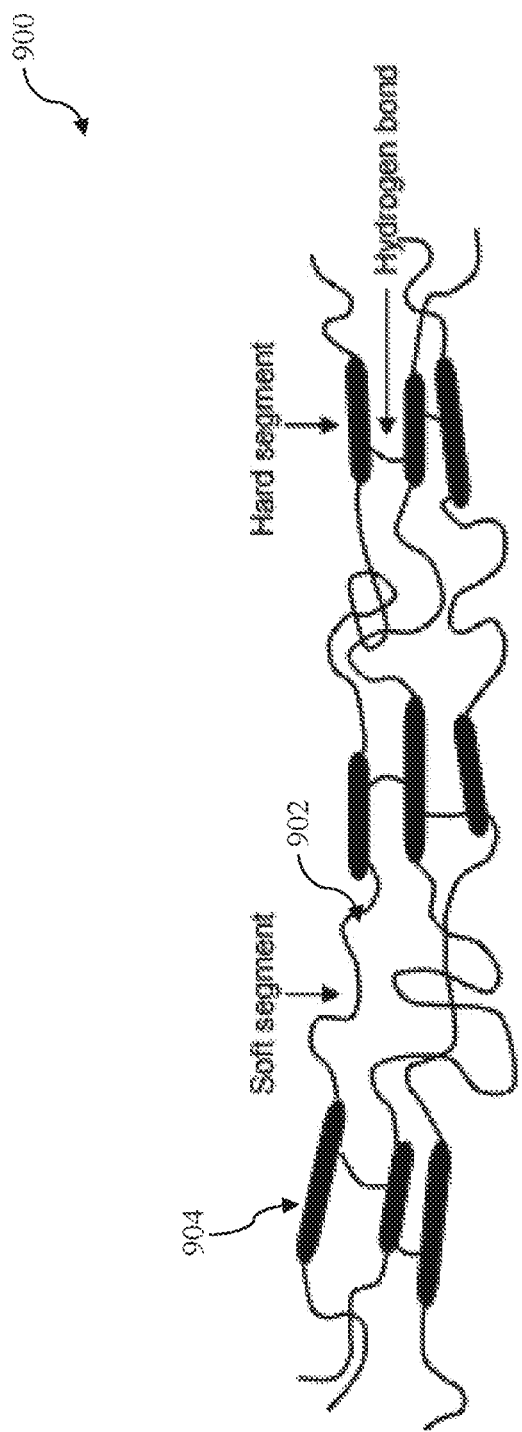
FIG. 9 is a schematic diagram of an adhesive material, constructed in accordance with some embodiments.

An adhesive material 900 is schematically illustrated in FIG. 9, in accordance with some embodiments. In some examples, thermal conductive adhesive layer 700 includes the adhesive material 900. The adhesive material 900 includes a block copolymer having a first block 902 and a second block 904 chemically bonded. In some embodiments, the first block 902 is a soft segment having a flexible chemical structure with less mechanical strength and the second block 904 is a hard segment having a rigid structure with higher mechanical strength. Additional hydrogen bonds may present between the hard segments. Overall, such adhesive material has a high mechanical strength at a temperature below the glass transition temperature Tg; has an excellent gap filling property due to phase transformation from solid to elastomer; and has advantages of a plastic and cross-linked material (such as high extension and mechanical strength). Particularly, it has better nano-size gap filling due to its duality of flexibility and rigidity, which enhance both the adhesion and mechanical strength. Furthermore, if the second block 904 is designed to be thermal conductive, then such adhesive material on its own is able to function as the thermal conductive adhesive layer without adding other thermal conductive particles.

Figure 10:
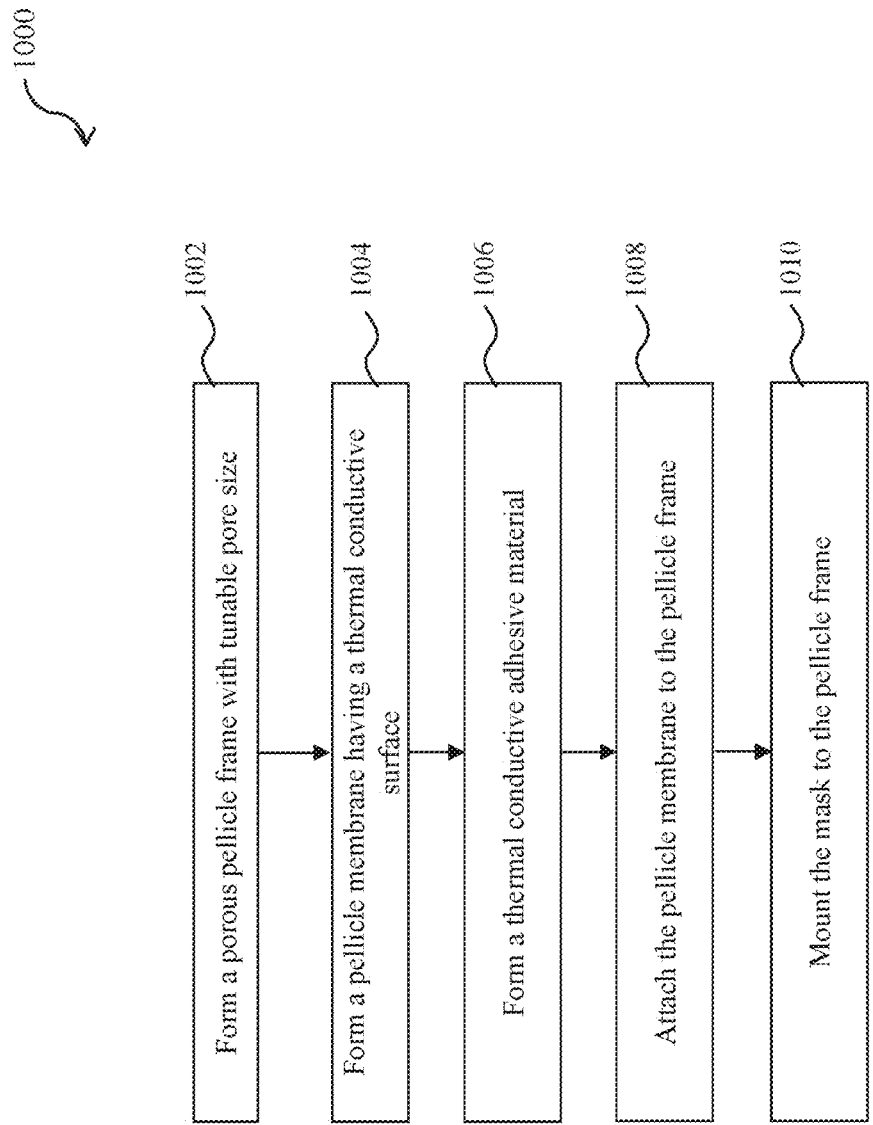
FIG. 10 is a flowchart of a method constructed in accordance with some embodiments.

Referring now to FIG. 10, illustrated is a flowchart of a method 1000 fabricating a mask pellicle system 300 constructed according to aspects of the present disclosure in some embodiments. The method 1000 includes operation 1002 fabricating a porous pellicle frame 304. The formation of the pellicle frame 304 may include solid sintering, liquid sintering, evaporation sintering or other suitable technique, such described above in various examples.

The method 1000 includes operation 1004 fabricating a pellicle membrane 306 with a thermal conductive surface. The formation of the membrane 306 may include depositing a capping layer on the transparent film and further depositing a thermal conductive layer on the capping layer. Alternatively, the formation includes depositing, on the transparent film, one layer that function as both thermal conduction and protection.

The method 1000 includes operation 1006 forming thermal conductive adhesive material. The formation of the thermal conductive adhesive material includes mixing the adhesive component and the thermal conductive component. The formation may further include other steps, such as orienting the elongated thermal conductive particles by an external field (such as electric field or magnetic field) for enhanced thermal conductivity.

The method 1000 includes operation 1008 bonding the pellicle membrane to the pellicle frame using the thermal conductive adhesive material. The bonding process may include applying pressure, curing, applying external field (for orienting), or a combination thereof. For example, an external field may be applied to the elongated thermal conductive particles of the thermal conductive adhesive material during the bonding process for enhanced thermal conductivity.

In some embodiments, the method 1000 may further include operation 1010 mounting the mask to the pellicle frame using the thermal conductive adhesive material. The mounting process may be similar to the operation 1008. For example, the mounting process includes applying pressure, curing, applying external field (for orienting), or a combination thereof. Alternatively, this operation may be implemented in the semiconductor fabrication process. Thus formed mask pellicle system is used in a lithography patterning process.

Referring now to FIG. 11, illustrated is a flowchart of a method 1100 used for performing a lithography process in an integrated circuit fabrication constructed according to aspects of the present disclosure in some embodiments.

The method 1100 may begin at operation 1102 mounting the mask to the pellicle apparatus (the pellicle frame with the membrane attached thereon) using the thermal conductive adhesive material, thereby resulting in a mask pellicle system 300, as illustrated in FIGS. 1, 2 and 3. The mounting process may be similar to the operation 1008. For example, the mounting process includes applying pressure, curing, applying external field (for orienting), or a combination thereof.

The method 1100 includes operation 1104 loading a mask pellicle system 300 to a lithography system 100. The operation 1004 in the method 1100 may further include other steps, such as alignment after the mask pellicle system is secured on the mask stage 106.

The method 1100 then proceeds to operation 1106, where a semiconductor wafer is loaded to the substrate stage 118 of the lithography system 100. In some examples, the semiconductor wafer may be a silicon wafer coated with a photoresist layer. The photoresist layer is sensitive to the radiation beam from the radiation source 102 and is to be patterned by a lithography exposure process, such that the pattern defined on the mask is transferred to the photoresist layer. The method 1100 then proceeds to operation 1108, where a lithography exposure process is performed to transfer the pattern from the mask to the semiconductor wafer.

Additional operations can be provided before, during, and after the method 1100, and some of the steps described can be replaced, eliminated, or moved around for additional embodiments of the method 1100. In one example, the lithography process includes soft baking, mask aligning, exposing, post-exposure baking, developing photoresist, and hard baking.

The present disclosure provides a system for semiconductor lithography process, where the system includes a thermal conductive membrane, a pellicle frame of a porous material securing the membrane and thermal conductive adhesive material to bond the mask and the membrane to the pellicle frame. The porous material includes a plurality of pore channels configured to filter particles and provide pressure equalization. The thermal conductivities of the membrane and the adhesive layer provide thermal paths so that the heat generated by the lithography exposure process is able to be conducted, thereby reducing or eliminating the thermal stress and deformation of the mask.

Thus, the present disclosure provides an apparatus for a semiconductor lithography process in accordance with some embodiments. The apparatus includes a pellicle membrane with a thermal conductive surface; a porous pellicle frame; and a thermal conductive adhesive layer that secures the pellicle membrane to the porous pellicle frame. The porous pellicle frame includes a plurality of pore channels continuously extending from an exterior surface of the porous pellicle frame to an interior surface of the porous pellicle frame.

The present disclosure also provides a method for fabricating a pellicle assembly for a lithography process in accordance with some embodiments. The method includes fabricating a porous pellicle frame with tunable pore sizes; forming a pellicle membrane having a thermal conductive surface; and attaching the pellicle membrane to the pellicle frame such that the pellicle membrane is suspended by the pellicle frame using a thermal conductive adhesive material.

The present disclosure also provides a method for a lithography process. The method includes providing a pellicle apparatus, wherein the pellicle apparatus includes a membrane with a thermal conductive surface and a porous pellicle frame that secures the membrane across the pellicle frame by a thermal conductive adhesive material; mounting the pellicle apparatus onto a mask, wherein the mask includes a patterned surface; loading the mask having the pellicle apparatus mounted thereupon into a lithography system and loading a semiconductor wafer onto a substrate stage of the lithography system; and performing a lithography exposure process to transfer a pattern of the patterned surface from the mask to the semiconductor wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus for a semiconductor lithography process, comprising:
   a pellicle membrane;
   a porous pellicle frame, wherein the porous pellicle frame includes a pore channel extending from a first opening on an exterior surface of the porous pellicle frame to a second opening on an interior surface of the porous pellicle frame, wherein the first and second openings are not level with respect to a surface of the pellicle membrane facing the porous pellicle frame, wherein the porous channel includes a material selected from the group consisting of, boron nitride (BN), boron carbide (BC), and a combination thereof;
a mask with a patterned surface;
a first thermal conductive adhesive layer that secures the pellicle membrane to the porous pellicle frame; and
a second thermal conductive adhesive layer that secures the porous pellicle frame to the mask.

2. The apparatus of claim 1, wherein each of the first and second thermal conductive adhesive layers includes a plurality of thermal conductive particles disposed in an adhesive component.

3. The apparatus of claim 2, wherein the plurality of thermal conductive particles includes one of metal, metal alloy, thermal conductive ceramic material, thermal conductive polymer, and thermal conductive compound.

4. The apparatus of claim 2, wherein the plurality of thermal conductive particles includes one of Al, Ag, AlO, AlN, BN, carbon (graphene, nanotube or graphite sheet) Be, $B_4C$, SiC, and a combination thereof.

5. The apparatus of claim 2, wherein the plurality of thermal conductive particles includes particles of two different sizes mixed.

6. The apparatus of claim 2, wherein the adhesive component includes one of styrene ethylene/butylene styrene rubber (SEBS), thermoplastic polyester elastomer (TPE), polyether urethane (TPU), thermoplastic olefinic elastomer (TPO), and thermoplastic vulcanisate (TPV).

7. The apparatus of claim 2, wherein the adhesive component includes a block copolymer having a soft block and a hard block, and wherein the hard block is a thermal conductive block.

8. The apparatus of claim 1, wherein the porous pellicle frame includes a plurality of pore channels continuously extending from the exterior surface of the porous pellicle frame to the interior surface of the porous pellicle frame in random routes.

9. An apparatus for a semiconductor lithography process, comprising:
a pellicle membrane, wherein the pellicle membrane includes, from bottom to top, a first thermal conductive film, a first capping layer, a transparent material layer, a second capping layer, and a second thermal conductive film;
a porous pellicle frame; and
an adhesive layer that secures the first thermal conductive film of the pellicle membrane to the porous pellicle frame.

10. The apparatus of claim 9, wherein the transparent material layer includes polymer or graphene.

11. The apparatus of claim 9, wherein the porous pellicle frame is formed in a material selected from the group consisting of boron nitride (BN), boron carbide (BC), and a combination thereof.

12. The apparatus of claim 9, wherein the porous pellicle frame includes a pore channel extending from a first opening on an exterior surface of the porous pellicle frame to a second opening on an interior surface of the porous pellicle frame, wherein the first and second openings have different sizes.

13. The apparatus of claim 9, wherein the first and second capping layers include boron nitride (BN) or boron carbide (BC).

14. The apparatus of claim 9, wherein the transparent material layer has a thickness ranging between 30 nm and 50 nm.

15. A method for fabricating a pellicle assembly for a lithography process, comprising:
fabricating a porous pellicle frame with tuned pore sizes;
forming a pellicle membrane; and
mounting the pellicle membrane to the porous pellicle frame such that the pellicle membrane is suspended by the porous pellicle frame, wherein the mounting of the pellicle membrane includes applying a thermal conductive adhesive material between the pellicle membrane and the porous pellicle frame, wherein the thermal conductive adhesive material includes a block copolymer having first blocks chemically bonded with second blocks and hydrogen bonds between the second blocks, the second blocks have higher mechanical strength than the first blocks.

16. The method of claim 15, further comprising:
forming a mask with a patterned surface; and
mounting the mask to the porous pellicle frame such that the patterned surface is facing the pellicle membrane.

17. The method of claim 15, wherein the fabricating of the porous pellicle frame includes liquid sintering a first type of solid powder and a second type of solid powder to form a porous material.

18. The method of claim 17, wherein a volume of the first type of solid powder over a total volume of the porous material ranges from 40% to 80%.

19. The method of claim 15, wherein at least one of the second blocks is bonded to a first adjacent second block with a first hydrogen bond and bonded to a second adjacent second block with a second hydrogen bond.

* * * * *